United States Patent [19]

Hammerbacher

[11] Patent Number: 5,468,304
[45] Date of Patent: Nov. 21, 1995

[54] OUTPUT-INCREASING, PROTECTIVE COVER FOR A SOLAR CELL

[75] Inventor: Milfred D. Hammerbacher, Dallas, Tex.

[73] Assignee: Texas Instruments Incorporated, Dallas, Tex.

[21] Appl. No.: 212,542

[22] Filed: Mar. 14, 1994

[51] Int. Cl.⁶ .................... H01L 31/052; H01L 31/0384; H01L 31/18
[52] U.S. Cl. .................... 136/246; 136/250; 136/251; 437/2
[58] Field of Search .................... 136/246, 250, 136/251; 437/2–5, 212, 216

[56] References Cited

U.S. PATENT DOCUMENTS 3,025,335  3/1962  Ralph ........................ 136/250

*Primary Examiner*—Aaron Weisstuch
*Attorney, Agent, or Firm*—Robert C. Klinger; James C. Kesterson; Richard L. Donaldson

[57] ABSTRACT

A flexible cover (14) for a flexible solar cell (12) protects the cell from the ambient and increases the cell's efficiency. The cell (12) includes silicon spheres (16) held in a flexible aluminum sheet matrix (20,22). The cover (14) is a flexible, protective layer (60) of light-transparent material having a relatively flat upper, free surface (64) and an irregular opposed surface (66). The irregular surface (66) includes first portions (68) which conform to the polar regions (31R) of the spheres (16) and second convex (72) or concave (90) portions (72 or 90) which define spaces (78) in conjunction with the reflective surface (20T) of one aluminum sheet (20). Without the cover (14) light (50) falling on the surface (20T) between the spheres (16) is wasted, that is, it does not fall on a sphere (16). The surfaces of the second portions are non-parallel to the direction of the otherwise wasted light (50), which fact, together with a selected relationship between the refractive indices of the cover and the spaces, result in sufficient diffraction of the otherwise wasted light (50) so that about 25% of it is reflected from the surface (20T) onto a sphere (16).

39 Claims, 3 Drawing Sheets

OUTPUT-INCREASING, PROTECTIVE COVER FOR A SOLAR CELL

BACKGROUND OF THE INVENTION

THE GOVERNMENT OF THE UNITED STATES OF AMERICA HAS RIGHTS IN THIS INVENTION PURSUANT TO SUBCONTRACT NO. ZAI-4-11294-04 AWARDED BY THE U.S. DEPARTMENT OF ENERGY.

The present invention relates to a protective cover for a solar cell, and, more particularly, to an output-increasing, protective cover for a solar cell.

Various types of photovoltaic ("PV") devices such as solar cells, for converting radiant energy, such as sunlight, into electricity are known. One type of solar cell which is of particular current interest comprises a plurality of spaced members, typically spherical or spheroidal particles, supported by a conductive sandwich which includes first and second conductive sheets separated by an insulative coating. Each sphere is a semiconductor, for example silicon having a P-type interior and an N-type exterior or skin.

The first sheet is a thin, flexible metallic foil, typically aluminum, with a plurality of spaced cell-retaining apertures formed therethrough, for example, by an emboss-then-etch or stamping process. The apertures typically define a regular geometrical pattern. Preferably, the pattern comprises overlapping hexagons which permits maximum packing of the apertures, and, hence, of the spheres. The spheres are placed on a top surface of the first foil and, by the use of negative pressure and doctoring or other techniques, each aperture ultimately has one sphere nested therein. Thereafter, heat and pressure are applied to the cell sandwich to move the nested spheres partially into and through the apertures. This movement effects the interaction of the aperture walls with the spheres to locally remove the native aluminum and silicon oxides so that the abutting aluminum mechanically bonds directly to, and forms an electrical contact with, the N-type exterior of the silicon spheres, thereby affixing the spheres to the first foil.

The affixing of the spheres to the first foil results in an upper light-gathering portion of each sphere protruding or extending above the top surface of the first foil and a lower portion of each sphere protruding below a lower surface of the first foil. The N-type exterior is removed from the cells below the first foil's lower surface. The lower foil surface and the exposed P-type interior of the lower sphere portions are then coated with a flexible, electrically insulative coating, typically a polyimide. The insulative coating on the spheres is then treated to remove some of the coating to thereby expose the P-type interior of each sphere through so-called vias.

Following via formation, the second foil, preferably a flexible aluminum, is electrically connected to the P-type interiors of the spheres through the vias. The flexible solar cell so formed may power utilization devices connected between the foils.

The foregoing and similar solar cells and techniques for producing them are disclosed in the following commonly assigned U.S. Pat. Nos.: 4,407,320; 4,521,640; 4,581,103; 4,582,588; 4,806,495; 4,872,607; 4,917,752; 4,957,601; 5,028,546; 5,192,400; 5,091,319; and 5,086,003.

The above-described solar cells comprise a plurality of miniature PV devices— the spaced silicon or other semiconductive members, spheres, spheroids or other particles— connected in electrical parallel via the first and second foils. The foils, therefore, are connectable to a utilization device or circuit for electrical energization thereof when the cells are exposed to radiant energy. The cells are flexible and may be formed into various non-planar configurations, either freestanding or conforming to an irregular underlying surface.

While solar cells constructed as set forth above are mechanically robust, protecting them from the deleterious effects of the environment and ambient conditions is generally thought to be prudent. For example, water in the form of rain or other precipitation, in prolonged direct contact with the spheres or other particles or the foils can cause oxidation and corrosion, giving rise to mechanical and/or electrical degradation of the cell. Pollutants may also deleteriously affect the cell, such as by attacking the spheres or foil of the cell or by decreasing or preventing radiant energy from reaching the particles or spheres.

For the foregoing and other reasons, it is typical to cover, encapsulate or otherwise house solar cells to protect them against ambient-caused degradation. Such protective measures viewed in the context of prior art non-flexible solar cells have often taken the form of rigid "picture frames" having a transparent cover which surrounds the solar cell to isolate it from the ambient. The cover, of course, permits sunlight and other radiation to reach the cells where it is converted to electricity. Such picture frame covers are not flexible and limit the range of uses to which the flexible cells of the above patents may be put.

The upper portion of each particle or sphere—typically an N-type silicon hemisphere—functions as a spherical lens. That is, this upper portion gathers light incident on the particle or sphere and directs this light onto the particle's or sphere's P-N junction. These spherical lenses are able to direct to the P-N junction only that light which is directly incident on the particles spheres. Some of the light which is incident on the top surface of the first foil between the particles or spheres—that is, light which "misses" the particles or spheres—is, in effect, "wasted" and is not effective to produce electricity, because it does not reach the P-N junction of the spheres, and is, instead, back-reflected to the ambient.

Commonly assigned U.S. patent application, Ser. No. 08/060,773, filed May 11, 1993 discloses a flexible protective cover with an undulating free surface which comprises a coating having particle-conformal portions which extend into the spaces between adjacent particles. The portions of the coating conforming to each particle act as lenses, directing otherwise "wasted" light—light which would fall on the first foil between adjacent particles and be reflected back along its incoming path—onto the underlying particle. While this cover achieves solar cell efficiency increases of about 10%–20% (for a given amount of radiant energy incident on the cell), dirt and pollution-borne contaminants can be difficult to remove from its undulating irregular free surface.

The present invention contemplates the provision of a cover for solar cells which encapsulates and protects the cells from the ambient and which directs onto the particles or spheres a significant amount of the otherwise "wasted" light incident on the solar cells. The present invention also contemplates a flexible cover having the foregoing characteristics which permits the forming of flexible solar cells capable of assuming non-planar configurations, as well as methods for producing the aforenoted cover. The present invention further contemplates a cover which is easier to clean and which achieves a comparable efficiency increase to that of the '773 application.

SUMMARY OF THE INVENTION

Accordingly, the present invention contemplates a cover for a photovoltaic cell. The cell includes a number of spaced semiconductor particles. Portions of the particles extend away from a reflective surface, and the particle portions are exposed to radiant energy directed at the cell. Preferably, the particles are spheres or spheroids of a semiconductor material such as silicon and the reflective surface is one surface of a flexible sheet or foil, which may be a metal such as aluminum, by which the particles are held. Preferred cells according to the foregoing construction are flexible.

The particle portions are hemispherical or nearly hemispherical portions of the spheres or spheroids which extend away from or protrude above the reflective surface of the sheet. A significant amount of the radiant energy falling on the cell is perpendicular or nearly perpendicular to the reflective surface between adjacent particles. Such energy is reflected in such a way that it does not fall on the particle portions. Usually this radiant energy is reflected back virtually along its incident path and is "wasted," that is, is not used by the particle to produce electricity. Where about 20% of the cell's area is the reflective surface, about 20% of the energy incident on the cell is "wasted."

The cover of the invention includes a layer of radiant-energy transparent material having a free or upper surface and an opposed surface. The opposed surface is irregular. This irregularity results from the opposed surface conforming to the polar or upper regions of the particle portions and being configured into prism-like cusps, extensions, projections or deformations between adjacent particles. The cusps approach, but do not contact the reflective surface. The resulting spaces, gaps or volumes between the cusps and the reflective surface may contain a substance, such as air, other gases, a liquid, a polymer of a different index of refraction, or may be evacuated. The material between adjacent particles may be concave as viewed form the reflective surface. The resulting spaces are otherwise similar to those previously noted.

The configuration of the cusps or concavities and the refractive indices of the layer and the resulting spaces are related and cooperate so that a significant amount of the radiant energy which passes through the layer between adjacent particles—which radiant energy, as noted above, would be otherwise "wasted"—is reflected by the reflective surface onto the particle portions.

Specifically, the otherwise "wasted" radiant energy is refracted as it passes through the cusp-space or concavity-space interfaces. The refraction causes the radiant energy to impinge on and to be reflected from the reflective surface in a non-perpendicular manner. The non-perpendicularity of the reflection directs the energy onto the particle portions. The path taken by the otherwise "wasted" energy is generally along the cusp proximate to one of the adjacent particles and then onto and away from the reflective surface and along the cusp proximate the other adjacent particle, in the case of the cusps, or onto the one particle, in the case of the concavities.

Preferably the free surface of the cover is smooth and easy to keep clean and the cover is flexible so that it can be shaped with the flexible cell.

The cover may increase cell efficiency up to 25% as it protects the cell from harm caused by the ambient.

According to the method aspects of the present invention, the cover is produced by contacting the poles of the particles with a layer of a radiant energy-transparent, compressible material and then applying forces to the free surface of the layer in the direction of the reflective surface so that the opposed surface of the layer assumes the irregular configuration which functions in the manner described above.

BRIEF DESCRIPTION OF THE DRAWING

The Figures depicting the present invention are exaggerated, are not to scale and are configured only to illustrate the principles of the present inventions.

DETAILED DESCRIPTION

Figure 1:
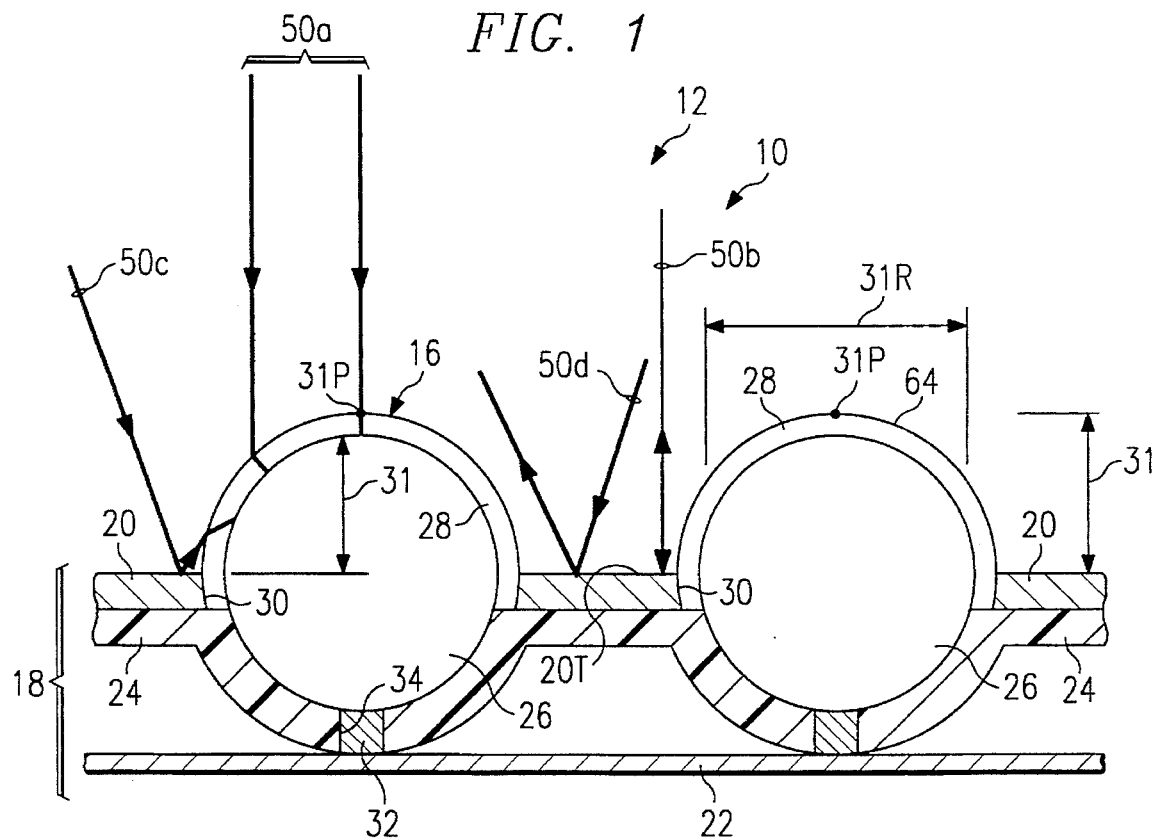
FIG. 1 is a sectioned front elevation of a fragment of a solar cell.
Figure 2:
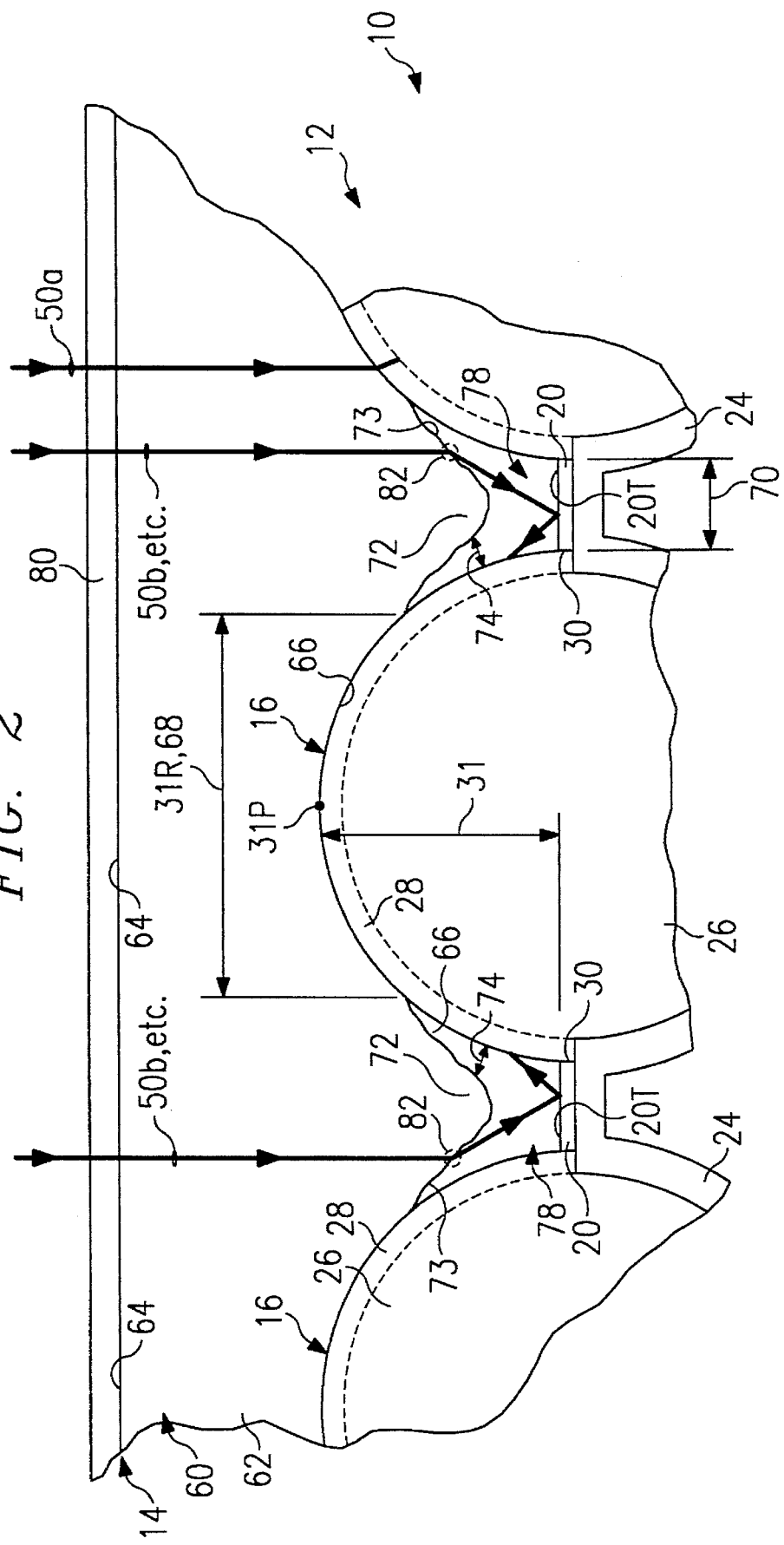
FIG. 2 is similar to FIG. 1 and illustrates a solar cell fragment on a part of which there has been produced a cover according to the principles of the present invention.
Figure 4:
FIG. 4 is an enlarged photographic negative showing a plan view of a solar cell pursuant to FIG. 2 having thereon a cover according to the present invention.

Referring to FIGS. 1 and 2 there are shown sectioned elevational views of fragments 10 of a solar cell 12. In FIG. 2 the solar cell 12 is protected by a cover 14 according to the present invention, while the solar cell 12 of FIG. 1 is not so protected.

The cell 12 may include a plurality of spaced semiconductive particles or members 16, which are preferably spheres or spheroids having diameters of about 25–45 mils and typically constituted of silicon, affixed to a conductive sandwich 18. Adjacent particles or spheres 16 are typically spaced apart by 1–4 mils. The conductive sandwich 18 may include a first or upper metallic foil 20 and a lower or second metallic foil 22 separated by an intervening insulative coating 24. Both foils 20 and 22 are preferably flexible and may be fabricated from aluminum. The coating 24 is also preferably flexible and may be a polyimide. The flexibility of the foils 20,22 and the coating 24 results in the cell 12 being flexible and conformally or otherwise shapable.

The particles or spheres 16 include an interior portion 26 of one conductivity type, e.g., P-type, and an outer portion 28 of the opposite conductivity type, e.g., N-type. The particles or spheres 16 are affixed or mounted to the first foil 20 by locating them in apertures 30 formed therein, with the walls of the apertures 30 being mechanically and electrically connected to the N-type outer portions 28. An extending or upper portion 31 of each particle or sphere 16 extends away or protrudes above a first or top surface 20T of the first foil 20. The first surface 20T of the first foil 20 is typically reflective.

The extending portion 31 of each particle 16, whether or not it is a sphere, may be viewed as having a pole 31P and an upper, surrounding polar region 31R. The second foil 22 is mechanically and electrically connected to the interior portion 26 of each particle or sphere 16. To that end the outer portion 28 of each particle or sphere 16 below the first foil 20 is removed and the resulting exposed interior portion 26 of each sphere 16 and a second or lower surface of the first foil 20 are covered with the insulative coating 24. The second foil 22 electrically contacts metallic contacts 32 which engage the interior portions 26 of the spheres 16 and are positioned in vias or holes 34 formed through the insulative coating 24.

When light or other appropriate radiant energy 50 is perpendicularly or nearly perpendicularly—or, vertically or nearly vertically—incident on the cell 12, some of it 50a, as shown in FIG. 1, is directly incident on the extending or upper portions 31 of the particles or spheres 16, including the pole 31P and polar region 31R thereof. Some of the light 50*b* is incident on the first or top surface 20T of the first foil 20 between the adjacent particles or spheres 16. Since a substantial amount of the light 50*b* perpendicularly or vertically incident on the top foil surface 20T is perpendicularly reflected back away from the foil 20, little, if any, of this light 50*b*, ever reaches the particles or spheres 16. In typical cells 12, about 20% of the cell area comprises the regions of the first surface 20T between the adjacent particles or spheres 16. Thus, about 20% of the incident light 50 is "wasted." The upper portions 31 of the spheres 16, comprising the N-type silicon 28, function as spherical lenses to gather and direct the light 50*a* incident thereon onto the P-N junctions 26–28 of the spheres 16. Light incident on this junction 26–28 produces electricity which flows in the foils 20 and 22 for consumption by a utilization device or circuit.

As noted, a majority of the light 50 collected by the upper sphere portions 31 is the perpendicular/vertical or nealy perpendicular/vertical light 50*a* directly incident thereon. Some small amount of the light 50*c* non-perpendicularly incident on or reflected from the top foil surface 20T will, depending on its angle of incidence and proximity to a sphere 16, be collected by the spherical lens 31 thereof and directed to the P-N junctions 26–28, as shown to the left of the leftwardmost sphere 16. Most of the light 50 incident directly on the top foil surface 20T is either reflected away therefrom along its incident path, as shown at 50*b* for perpendicularly incident light, or is reflected away without striking a sphere 16, as shown at 50*d* to the right of the leftwardmost sphere 16 in FIG. 1. In effect, most of the light 50*b*, 50*c*, 50*d* not falling directly on the spheres 16 is "wasted," that is, it is not effective in the production of electricity by the particles or spheres.

Various elements and portions of the cell 12 may be damaged or otherwise adversely affected by the environment. Rain, other precipitation, particulate matter, pollutants and other contents of the ambient can corrode, etch, render opaque and otherwise damage the cell 12. In view of this, the prior art typically resorted to enclosing rigid solar cells in a picture frame-like structure with glass or other optically clear material overlying the upper sphere portions for protecting the cell 12 against environmental damage. The cover 14 according to the present invention protects the cell 12 against such environmental damage and increases the output of the cell 12 for a given amount of light 50 incident thereon. The cover 14 is also flexible, permitting the flexible cell 12 to be formed into various non-planar configurations.

The cover 14 shown in FIG. 2, directs much of this otherwise "wasted" light 50*b*, etc. onto the particles or spheres 16 and protects the cell 12 against the deleterious effects of the environment.

The cover 14 includes a radiant energy-transparent or optically clear layer 60 which absorbs little if any of radiation in the solar spectrum, defined herein to mean radiation having a wavelength within the approximate range of 0.4–1.1 micron. Radiation within this wavelength range is particularly effective in producing electricity at the P-N junction 26–28. Preferably, the layer 60 also resists the deleterious effects— such as embrittlement, cracking, warping or other deformation, loss of flexibility and clouding—of UV and high temperatures.

The layer 60 is flexible and is compressible and conformable, that is, it can be extruded or deformed into small gaps and can be conformed to irregular surfaces. In preferred embodiments, the layer 60 is a foamed polymer or plastic tape 62 having a thickness of about 10–20 mils. Polymer materials such as acrylic, ethylene vinyl acetate, and fluoropolymers have been found suitable, with acrylic being preferred. For purposes of the present description, the layer 60 will be viewed as having a free or upper surface 64 and an opposed or second surface 66.

The tape 62 or other layer 60 is first placed on top of the particles or spheres 16 with the opposed surface 66 in contact with the poles 31P thereof. Next, forces are applied to the free surface 64 of the tape 62. These forces are directed toward the reflective surface 20T of the first foil 20, effect the adherence of the cover to the cell 12, and render the second surface 66 of the tape 62 irregular to achieve two results.

First, the second surface 66 is urged against the poles 31P and the polar regions 31R of the extending or upper portions 31 of the particles 16. In this manner the second surface 66 becomes conformal with the polar regions 31R, as indicated at 68. Second, the tape 62 is extruded or forced into the separation 70 between adjacent particles 16 so that, within each separation 70, the second surface 66 is configured as a convexity configured as a prism-like cusp, projection or similarly shaped extension 72.

Each cusp or prism 72 is continuous with the adjacent conformal areas 68 of the second surface 66. The walls or sides 73 of the cusps or prisms 72 are spaced away from the adjacent particles 16 by gaps 74 which increase in the direction of the reflective surface 20T. Stated differently, the walls 73 of the cusps or prisms 72 are highly inclined relative to each other and to the adjacent particles or spheres 16, are highly inclined relative to and are not perpendicular to the reflective surface 20T, and are highly inclined and are not parallel to light 50*b* directed at the cell 12 generally perpendicularly to the reflective surface 20T.

The terminus of each cusp or prism 72 approaches, but is spaced from, the reflective surface 20T. A space or chamber-like volume 78 is therefore defined by the walls 73 of each cusp or prism 72, the particles 16 adjacent thereto and the reflective surface 20T.

Preferably, the free surface 64 of the tape 62 is and remains flat, meaning smooth and non-rough, regardless of the non-planar configuration assumed by the cell 12 and the cover 14. In this manner, the cover 14 is less likely to retain dirt or pollutants. Dirt and pollutants which adhere to the flat free surface 64 are easy to remove therefrom. In forming the conformal areas 68 and the cusps or prisms 72, as described above, and/or in order to maintain the free surface 64 of the tape 62 flat, the forces applied to the free surface 64 of the tape 62 may be accompanied by the application of heat. Such heat or an appropriate adhesive may also be employed to adhere the cover to the cell 12.

A flat outer layer 80 may be applied to the free surface 64 of the tape 62 to ensure that the outermost surface of the cover is flat. The characteristics of the outer layer 80 may be selected to enhance or ensure the ambient-protective function of the cover, and to that end, the outer layer 80 has optical and protective properties similar to those of the tape 62.

The cover 14, like the cell 12, is flexible. As the cell 12 assumes various configurations, the free surface 64 of the tape 62 remains essentially parallel to the reflective surface 20T of the first foil 20. Moreover, the walls 73 of the cusps or prisms 72 maintain the above-described relationships with the adjacent particles or spheres 16, the reflective surface 20T and the light 50*b*, etc. during flexing of the cell 12 and its cover 14. As a consequence, whether or not the cell 12 assumes a non-planar configuration, the layer 60, and particularly the cusps 72 of the irregular surface 66 thereof, effect an increase in the efficiency of the cell 12.

Specifically, and referring to FIG. 2, the irregular surface 66 of the tape 62 and the cusps or prisms 72 thereof function to direct otherwise "wasted" light 50b, etc. which would fall on the reflective surface 20T between adjacent particles or spheres 16 if the cover 14 was not present, onto the extending or upper portions of the adjacent particles or spheres 16.

The vertical or nearly vertical light 50b, etc. enters the tape 62 through its free surface 64 from the ambient or after passing through the outer layer 80, if such is present. The light 50b, etc. then vertically or nearly vertically traverses the cusps or prisms 72 and passes through the interfaces between the walls 73 of the cusps 72 and the space 78, as indicated at 82. The indices of refraction of the material of the tape 62 and of the space 78 are selected to cooperate with the highly inclined orientation of the walls 73 so that the light 50b, etc. is highly refracted at the interfaces 82 as shown in FIG. 2.

The highly refracted light 50b, etc. passes through the gap 74 along the wall 73 of the cusp or prism 72 proximate to one of the adjacent particles 16 and impinges non-perpendicularly on the reflective surface 20T. From the reflective surface 20T, the light 50b, etc. is non-perpendicularly reflected through the gap 74 along the wall 73 of the cusp or prism 72 proximate to the other adjacent particle 16 until it impinges on the portion 31 of such other adjacent particle 16.

The amount of refraction which occurs at the interfaces 82 depends in part on the index of refraction of the spaces 78. The spaces 78 may contain air. Because constant exposure of the cell 12 to moisture may be deleterious to its operation, the air in the spaces 78 may be dry, or appropriate moisture getters may be included in the spaces 78. Other gaseous or liquid substances, or polymers, which will not deleteriously affect the cell 12 may be included in the spaces 78 to selectively affect the refraction of the light 50b, etc. The spaces 78 may also be partially evacuated.

The efficiency increase effected by the cover 14 has been measured to be about 25% for a given amount of light 50 incident on the cell 12. The cover 14 of FIG. 2 causes an apparent increase of more than 10% in the diameters of the particles or spheres 16 when viewed from its free surface 64, which translates into an increase of more than 21% in the projected area of the particles 16 leading to a concomitant increase in electrical output. This apparent increase results in the increased efficiency of the cell 12 due to the increased amount of light 50b, etc. entering the spheres 16.

Figure 3:
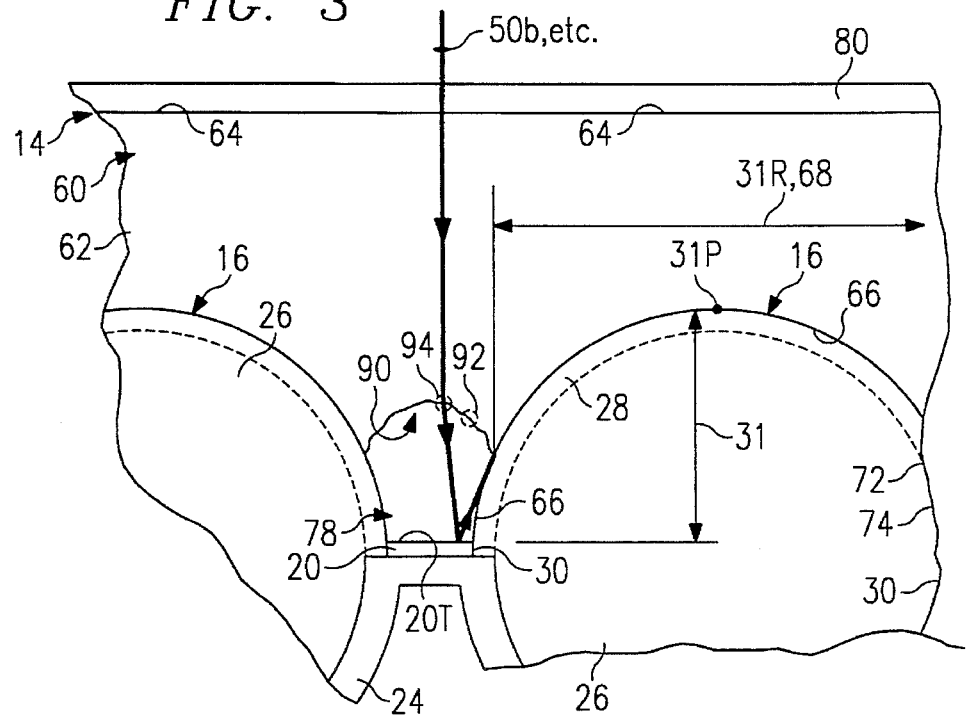
FIG. 3 illustrates a cover according to the present invention which is an alternative to that depicted in FIG. 2.

Depending on factors such as the flexibility and deformability of the tape 62 and the relative adherence between the surfaces of the particles 16 and the lower surface 66 of the tape 62, the placement of the tape 62 on the cell 12 may result in the formation of concavities 90 rather than the convex cusps or prisms 72. Such concavities 90 are depicted in FIG. 3. In the event of concavity 90 formation, the spaces 78 are bounded by the reflective surface 20T and the walls 92 of the concavities 90. As with the previous embodiment, if the spaces 78 contain a vacuum or a light-transparent gaseous, liquid or solid substance, the refractive index of which has an appropriate relationship to the refractive index of the tape 62, some of the light 50b, etc. will be prevented from being wasted and will enter the particles 16.

Specifically, light 50b, etc. generally perpendicular to the separation between adjacent particles 16 will, upon passing through a concavity wall 92-space 78 interface 94, change direction from nearly vertical to a path generally aimed at the particle 16 to which the light 50b, etc. was closer. The directionally altered light then is reflected from the surface 20T and into the closer particle 16. As will be recalled, the cusps or prisms 72 effected direction of light 50b, etc. entering a space 78 nearer to one particle 16 into another, adjacent particle 16. Thus, the cusps or prisms 72 and the concavities 90 are functional equivalents, even though each directs the otherwise wasted light 50b, etc. along different paths. In both embodiments, the under surface 66 of the cover 14 between adjacent particles 16 is not perpendicular to the vertical or nearly vertical light 50b, etc. which is, accordingly, diffracted within the space 78 for non-normal reflection by the surface 20T into a particle 16.

Those skilled in the art will appreciate that numerous other embodiments and equivalents of those disclosed are within the purview of the foregoing description and are covered by the following claims. Such persons will also appreciate that both the angular relationship of the walls 73,92 to the direction of the wasted light 50b, etc. and the refractive indices of the cusps 72 or concavities 90 may be adjusted to achieve various increases in the efficiency of the cell 12.

What is claimed is:

1. A covered photovoltaic cell, the cell including a plurality of spaced semiconductor particles having portions extending away from a reflective surface so that the particle portions are exposed to radiant energy directed at the cell; a substantial amount of the radiant energy which impinges on the reflective surface between adjacent particle portions being wasted due to its being reflected so as to not fall upon the particle portions, the cell comprising:

a layer of radiant energy-transparent material having a free surface and an opposed, irregular surface, wherein first portions of the irregular surface conform to the polar regions of adjacent particle portions, and second portions of the irregular surface between the pole-conforming portions thereof have surfaces which are non-perpendicular to the direction of the otherwise wasted radiant energy, spaces being defined between the second portions of the irregular surface and the reflective surface;

both (a) the angular relationship between the surfaces of the second portions of the irregular surface and the otherwise wasted radiant energy and (b) the refractive indices of the layer and the spaces being such that a significant amount of the otherwise wasted radiant energy which passes through the layer and each layer-space interface between adjacent particles is reflected by the reflective surface onto the particle portions.

2. A cell as in claim 1, wherein:

the second portions of the irregular surface comprise prism-like projections.

3. A cell as in claim 2, wherein:

the radiant energy is refracted at each projection-space interface and the path taken by the refracted radiant energy is generally along the projection proximate to one of the adjacent particles, onto the reflective surface, and then away from the reflective surface along the projection proximate to the other adjacent particle, and then onto the extending portion of such other adjacent particle.

4. A cell as in claim 1, wherein:

the second portions of the irregular surface comprise concavities.

5. A cell as in claim 4, wherein:

the radiant energy is refracted at each concavity-space interface and the path taken by the refracted radiant energy is generally along and proximate to one of the adjacent particles, onto the reflective surface, and then away from the reflective surface onto the extending portion of such one particle.

6. A cell as in claim 1, wherein:

the cover optically magnifies the apparent diameters of the particles as viewed from the free surface of the cover.

7. A cell as in claim 6, wherein:

the particles are semiconductor spheres or spheroids having diameters of between about 25 mils to about 45 mils, the reflective surface occupies about 20% of the cell area, the cover is about 20 mils thick, and the magnification is about 10%.

8. A cell as in claim 1, wherein:

the reflective surface is a surface of a flexible member which holds the particles, and the cover is flexible.

9. A cell as in claim 8, wherein:

the particles are semiconductor spheres or spheroids.

10. A cell as in claim 1, wherein:

the free surface of the cover and the reflective surface are spaced apart substantially uniformly over the areas of both thereof regardless of the configuration assumed by the cell upon flexing.

11. A cell as in claim 1, wherein:

the free surface of the cover is configured so as to not attract and retain significant amounts of particulate matter from the ambient.

12. A cell as in claim 11, wherein:

the free surface of the cover is substantially smooth.

13. A cell as in claim 1, wherein:

the cover optically magnifies the apparent diameters of the particles as viewed from the free surface of the cover by about 10%.

14. A cover as in claim 1, wherein:

the spaces are evacuated.

15. A cell as in claim 1, wherein:

the spaces contain a substance.

16. A cell as in claim 15 for a solar cell in which the reflective surface occupies approximately 20% of the cell area, wherein:

the cover increases the efficiency of the cell by about 25% for a given amount of radiant energy incident on the cell.

17. A cell as in claim 15, wherein:

the substance is a gas.

18. A cell as in claim 17, wherein:

the gas is air.

19. A cell as in claim 15, wherein:

the substance is substantially free of water vapor.

20. A cell as in claim 15, wherein:

the substance is a liquid.

21. A cell as in claim 15, wherein:

the substance is a solid.

22. A cell as in claim 21, wherein:

the solid is a polymer.

23. A cell as in claim 1, wherein:

the layer is a foamed polymer tape.

24. A cell as in claim 23, wherein:

the polymer is acrylic, ethylene vinyl acetate, or fluoropolymer.

25. A cell as in claim 24, wherein:

the polymer is an acrylic layer about 10–20 mils thick.

26. A method of producing a covered photovoltaic cell, the cell including a plurality of spaced semiconductor particles having portions extending away from a reflective surface so that the particle portions are exposed to radiant energy directed at the cell; a substantial amount of the radiant energy which impinges on the reflective surface between adjacent particles being wasted due to its being reflected so as to not fall upon the particle portions, the method comprising:

(a) contacting the polar regions of the particles with a layer of radiant energy-transparent, compressible material; and (b) applying forces to the free surface of the layer in the direction of the reflective surface so that (i) the opposed surface of the layer assumes an irregular configuration, first portions of which conform to the polar regions of adjacent particle portions and second portions of which between the pole-conforming portions have surfaces which are non-perpendicular to the otherwise wasted radiant energy and (ii) spaces are defined between the second portions of the irregular surface and the reflective surface;

(c) both (i) the angular relationship between the surfaces of the second portions of the irregular surface and the otherwise wasted radiant energy and (ii) the refractive indices of the layer and the spaces being such that a significant amount of the otherwise wasted radiant energy which passes through the layer and each layer-space interface between adjacent particles is reflected by the reflective surface onto the particle portions.

27. A method as in claim 26, wherein:

the reflective surface is a surface of a flexible member which holds the particles, the cell being flexible and conformal as a consequence, and the cover is flexible and conformal.

28. A method as in claim 26 wherein:

the particles are semiconductor spheres or spheroids.

29. A method as in claim 26, wherein:

the free surface of the layer and the reflective surface are spaced apart substantially uniformly over the areas of both thereof regardless of the configuration assumed by the cell.

30. A method as in claim 26, wherein:

the free surface of the layer is configured so as to not attract and retain ambient particulate matter.

31. A method as in claim 30, wherein:

the free surface of the layer is substantially smooth.

32. A method as in claim 26, wherein:

the reflective surface occupies approximately 20% of the cell area, and the cover increases the efficiency of the cell by about 25% for a given amount of radiant energy incident on the cell.

33. A method as in claim 26, wherein:

the second portions of the irregular surface comprise prism-like projections.

34. A method as in claim 26, wherein:

the second portions of the irregular surface comprise concavities.

35. A method as in claim 26, which further comprises:

evacuating the spaces.

36. A method as in claim 26, which further comprises:
filling the spaces with a substance.

37. A method as in claim 36, wherein:
the substance is a gas, a liquid or a solid.

38. A method as in claim 37, wherein:
the substance is substantially free of water vapor.

39. A method as in claim 37, wherein:
the substance is air.

* * * * *